(12) United States Patent
Wang et al.

(10) Patent No.: US 12,306,497 B2
(45) Date of Patent: May 20, 2025

(54) DISPLAY DEVICE (71) Applicant: AUO Corporation, Hsinchu (TW)

(72) Inventors: Ying-Ming Wang, Hsinchu (TW); Ruei-Hung Tsai, Hsinchu (TW)

(73) Assignee: AUO Corporation, Hsinchu (TW)

( * ) Notice: Subject to any disclaimer, the term of this patent is extended or adjusted under 35 U.S.C. 154(b) by 0 days.

(21) Appl. No.: 18/498,073

(22) Filed: Oct. 31, 2023

(65) Prior Publication Data
US 2024/0231151 A1 Jul. 11, 2024

(30) Foreign Application Priority Data

Jan. 5, 2023 (TW) .................................. 112100416

(51) Int. Cl.
G02F 1/13357 (2006.01)
H05K 1/18 (2006.01)

(52) U.S. Cl.
CPC .. *G02F 1/133608* (2013.01); *G02F 1/133603* (2013.01); *H05K 1/189* (2013.01); *H05K 2201/10136* (2013.01)

(58) Field of Classification Search
CPC ......... G02F 1/133608; G02F 1/133308; G02F 1/133314; G02F 1/133317; G02F 1/13332; G02F 1/133322; G02F 1/133325; G02F 1/133328; G02F 1/16753; G02F 1/133602; G02F 1/133603; G02F 1/1336; G02F 1/133604; G02F 1/13452; G02F 1/13318; G02F 1/133615; H05K 1/189; H05K 1/028; H05K 2201/10136; H05K 2201/10106; H05K 1/0212; H05K 1/0243; H05K 1/0271; H05K 1/0278; H05K 1/118; H05K 1/182; H05K 3/0008; G02B 6/009; G02B 6/0068;
(Continued)

(56) References Cited

U.S. PATENT DOCUMENTS

2005/0088830 A1* 4/2005 Yumoto .................. H05K 1/147
174/254
2005/0286008 A1* 12/2005 Miyagawa ............ G06F 1/1601
349/158
(Continued)

FOREIGN PATENT DOCUMENTS

CN 1971344 A * 5/2007
CN 101226294 7/2008
(Continued)

*Primary Examiner* — Hoan C Nguyen
(74) *Attorney, Agent, or Firm* — JCIPRNET (57) ABSTRACT A display device includes a light source module, a housing, a display panel, a circuit board and a first flexible substrate. The housing includes a base plate, a sidewall and a support part. The base plate is below the light source module. The sidewall forms an accommodation space for the light source module. The support part is connected to the sidewall and extends away from the base plate, wherein the support part has a recess recessed towards the base plate. The display panel is above the light source module and the support part. The circuit board is below the support part, and the support part is located between the display panel and the circuit board. The first flexible substrate connects the light source module to the circuit board through the recess, wherein one side of the recess supports the display panel, and another side supports the circuit board.

17 Claims, 8 Drawing Sheets (58) Field of Classification Search
CPC ... G02B 6/0091; H01L 51/0097; G09F 9/301; G06F 1/1616; G06F 1/1641; H10K 77/111

See application file for complete search history.

(56) References Cited

U.S. PATENT DOCUMENTS

| | | | | |
|---|---|---|---|---|
| 2008/0076273 A1* | 3/2008 | Jang | .................... | H05K 1/189 439/56 |
| 2008/0278653 A1* | 11/2008 | Chung | .................. | G02B 6/009 349/65 |
| 2010/0165240 A1* | 7/2010 | Cho | ................ | G02F 1/133603 349/61 |

FOREIGN PATENT DOCUMENTS

| | | | |
|---|---|---|---|
| CN | 201203733 Y | * | 3/2009 |
| CN | 204287674 | | 4/2015 |
| CN | 205067918 | | 3/2016 |
| CN | 209570766 | | 11/2019 |
| JP | H1049067 A | * | 2/1998 |
| KR | 20130039118 | | 4/2013 |

* cited by examiner

DISPLAY DEVICE

CROSS-REFERENCE TO RELATED APPLICATION

This application claims the priority benefit of Taiwan application serial no. 112100416, filed on Jan. 5, 2023. The entirety of the above-mentioned patent application is hereby incorporated by reference herein and made a part of this specification.

BACKGROUND

Technical Field

The disclosure relates to a photoelectric device, and in particular relates to a display device.

Description of Related Art

In order to reduce the frame size of the current LCD display products, the rigid circuit board of the system is assembled on the back of the housing. However, since the flexible circuit substrate of the light source module needs to be connected to the rigid circuit board of the system, it is necessary to punch holes in the housing to allow the flexible circuit substrate to pass through. This results in a discontinuous structure of the housing, and the flexible circuit substrate is suspended at the outlet, leading to an easy occurrence of broken liquid crystal panel during mechanism testing, thereby reducing the product yield.

SUMMARY

A display device with improved product yield is provided in the disclosure.

A display device including a light source module, a housing, a display panel, a circuit board, and a first flexible substrate is provided in an embodiment of the disclosure. The housing includes a base plate, a sidewall, and a support part. The base plate is located below the light source module. The sidewall is connected to the base plate to form an accommodation space for accommodating the light source module. The support part is connected to the sidewall and extends in a direction away from the base plate, in which the support part has a recess recessed towards an extending plane of the base plate. The display panel is located above the light source module and the support part of the housing. The circuit board is located below the support part of the housing, and the support part of the housing is located between the display panel and the circuit board. The first flexible substrate connects the light source module to the circuit board through the recess of the support part, in which one side of the recess supports the display panel, and another side of the recess supports the circuit board.

In an embodiment of the disclosure, the support part of the housing has a top surface and a back surface opposite to each other, and the recess is recessed from the top surface towards the back surface.

In an embodiment of the disclosure, the display device further includes a first adhesive member covering the top surface of the support part.

In an embodiment of the disclosure, the first adhesive member continuously extends across the recess of the support part.

In an embodiment of the disclosure, the first flexible substrate is located between the first adhesive member and a bottom surface of the recess.

In an embodiment of the disclosure, the first adhesive member discontinuously extends past the recess of the support part, and the first flexible substrate is not covered by the first adhesive member.

In an embodiment of the disclosure, the display device further includes a second adhesive member covering the back surface of the support part.

In one embodiment of the disclosure, the second adhesive member discontinuously extends past the recess of the support part, and the second adhesive member is spaced apart and disposed on the back surface of the support part.

In an embodiment of the disclosure, the back surface of the recess abuts the circuit board.

In an embodiment of the disclosure, the display device further includes a third adhesive member located between the first flexible substrate and a bottom surface of the recess.

In an embodiment of the disclosure, the display device further includes a fourth adhesive member located between the back surface of the recess and the circuit board.

In an embodiment of the disclosure, the fourth adhesive member is electrically conductive.

In an embodiment of the disclosure, the display panel has a display area and a peripheral area, the light source module includes a substrate and a light source located above the substrate, and the light source overlaps the display area.

In one embodiment of the disclosure, the first flexible substrate has a light source connection part connected to the light source module, and the light source connection part and the light source are respectively disposed on two opposite sides of the substrate.

In an embodiment of the disclosure, the circuit board has a first surface and a second surface opposite to each other, and a side surface connecting the first surface and the second surface. The second surface of the circuit board faces the support part of the housing, and the first flexible substrate passes the second surface, the side surface, and first surface of the circuit board in sequence. The first flexible substrate is connected to the first surface of the circuit board.

In an embodiment of the disclosure, the display device also includes a second flexible substrate connected to the display panel. The second flexible substrate is connected to the first surface of the circuit board by passing the second surface, the side surface, and first surface of the circuit board in sequence.

In one embodiment of the disclosure, the second flexible substrate is directly bonded to the first surface of the circuit board, and the first flexible substrate is connected to a connector on the first surface of the circuit board.

In one embodiment of the disclosure, compared with the connector, the second flexible substrate is bonded to the circuit board at a location further away from the sidewall of the housing.

In an embodiment of the disclosure, a depth of the recess is less than a thickness of the first flexible substrate.

In an embodiment of the disclosure, a first spacing is between the base plate and the display panel, a second spacing is between the support part and the display panel, a third spacing is between the bottom surface of the recess and the display panel, the first spacing is greater than the third spacing, and the third spacing is greater than the second spacing.

In order to make the above-mentioned features and advantages of the disclosure comprehensible, embodiments accompanied with drawings are described in detail below.

DETAILED DESCRIPTION OF DISCLOSED EMBODIMENTS

In the drawings, for clarity, the thickness of layers, films, plates, areas, and the like are magnified. Throughout the specification, the same reference numerals denote the same elements. It should be understood that when an element such as a layer, a film, an area, or a substrate is indicated to be "on" another element or "connected to" another element, it may be directly on another element or connected to another element, or an element in the middle may exist. In contrast, when an element is indicated to be "directly on another element" or "directly connected to" another element, an element in the middle does not exist. As used herein, "to connect" may indicate to physically and/or electrically connect. Furthermore, "to electrically connect" or "to couple" may also be used when other elements exist between two elements.

It should be understood that, although the terms "first", "second", "third", or the like may be used herein to describe various elements, components, regions, layers, and/or portions, these elements, components, regions, and/or portions should not be limited by these terms. These terms are only used to distinguish one element, component, region, layer, or portion from another element, component, region, layer, or portion. Thus, a first "element," "component," "region," "layer," or "portion" discussed below may be referred to as a second element, component, region, layer, or portion without departing from the teachings herein.

The terminology used herein is for the purpose of describing particular embodiments only and is not limiting. As used herein, the singular forms "a", "an", and "the" are intended to include the plural forms including "at least one" or represent "and/or" unless the content clearly dictates otherwise. As used herein, the term "and/or" includes any and all combinations of one or more of the associated listed items. It should also be understood that, when used in this specification, the term "including" or "includes" specify a presence of the stated feature, region, whole subject, step, operation, element, and/or part, but not excluding the presence or addition of one or more other features, regions, whole subjects, steps, operations, elements, parts, and/or a combination thereof.

Moreover, relative terms such as "below" or "bottom" and "above" or "top" may serve to describe the relation between one element and another element in the text according to the illustration of the drawings. It should also be understood that the relative terms are intended to include different orientations of a device in addition to the orientation shown in the drawings. For example, if a device in the accompanying drawings is flipped, an element described as being on the "lower" side of other elements shall be re-orientated to be on the "upper" side of other elements. Thus, the exemplary term "lower" may cover the orientations of "upper" and "lower", depending on the specific orientations of the accompanying drawings. Similarly, if a device in the accompanying drawings is flipped, an element described as being "below" or "beneath" other elements shall be re-orientated to be "above" other elements. Thus, the exemplary terms "below" or "beneath" may encompass both an orientation of above and below.

Considering the discussed measurement and measurement-related deviation (that is, the limitation of measurement system), the usages of "approximately", "similar to" or "substantially" indicated throughout the specification include the indicated value and an average value having an acceptable deviation range, which is a certain value confirmed by people skilled in the art. For example, "approximately" may indicate to be within one or more standard deviations of the indicated value, or being within ±30%, ±20%, ±10%, ±5%. Furthermore, the usages of "approximately", "similar to", or "substantially" indicated throughout the specification may refer to a more acceptable deviation scope or standard deviation depending on optical properties, etching properties, or other properties, and all properties may not be applied with one standard deviation.

Unless otherwise defined, all terms (including technical and scientific terms) used herein have the same meaning as that commonly understood by one of ordinary skill in the art to which this disclosure belongs. It should be further understood that terms such as those defined in commonly used dictionaries should be construed as having meanings consistent with their meanings in the context of the related art and the disclosure, and are not to be construed as idealized or excessive formal meaning, unless expressly defined as such herein.

Exemplary embodiments are described with cross-sectional views of schematic illustrations of ideal embodiments. Thus, shape alterations as a result of, for example, manufacturing techniques and/or tolerances may be expected, and the illustrated regions of the embodiments described herein should not be construed to particular shapes but include shape deviations due to, for example, manufacturing. For example, regions shown or described as being flat may generally have rough and/or non-linear features. Furthermore, the acute angles shown may be round. Therefore, the regions illustrated in the drawings are only schematic representations and are not intended to illustrate the exact shapes of the regions or to limit the scope of the claims.

Figure 1A:
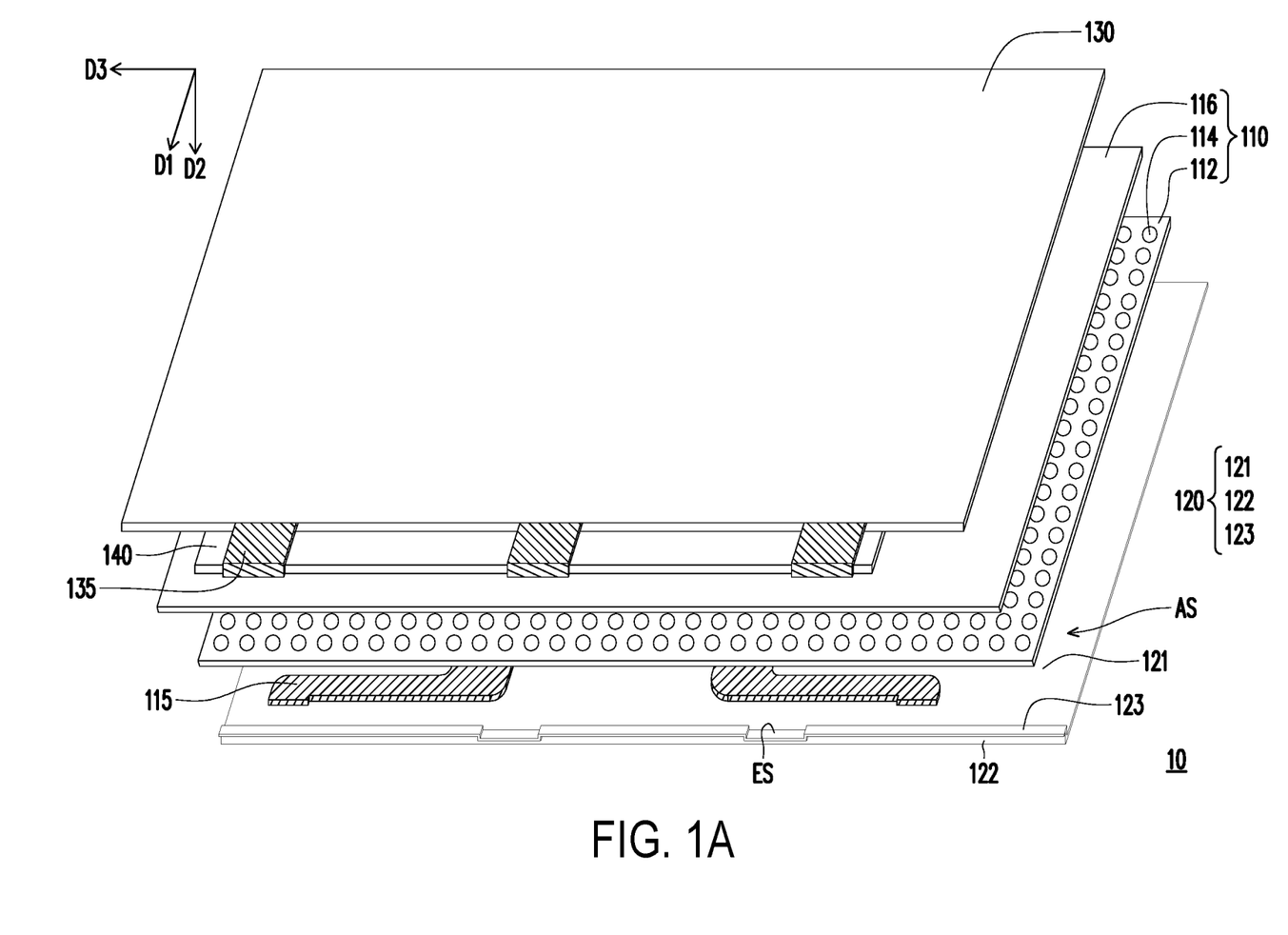
FIG. 1A is an exploded schematic diagram of a display device 10 according to an embodiment of the disclosure.
Figure 1B:
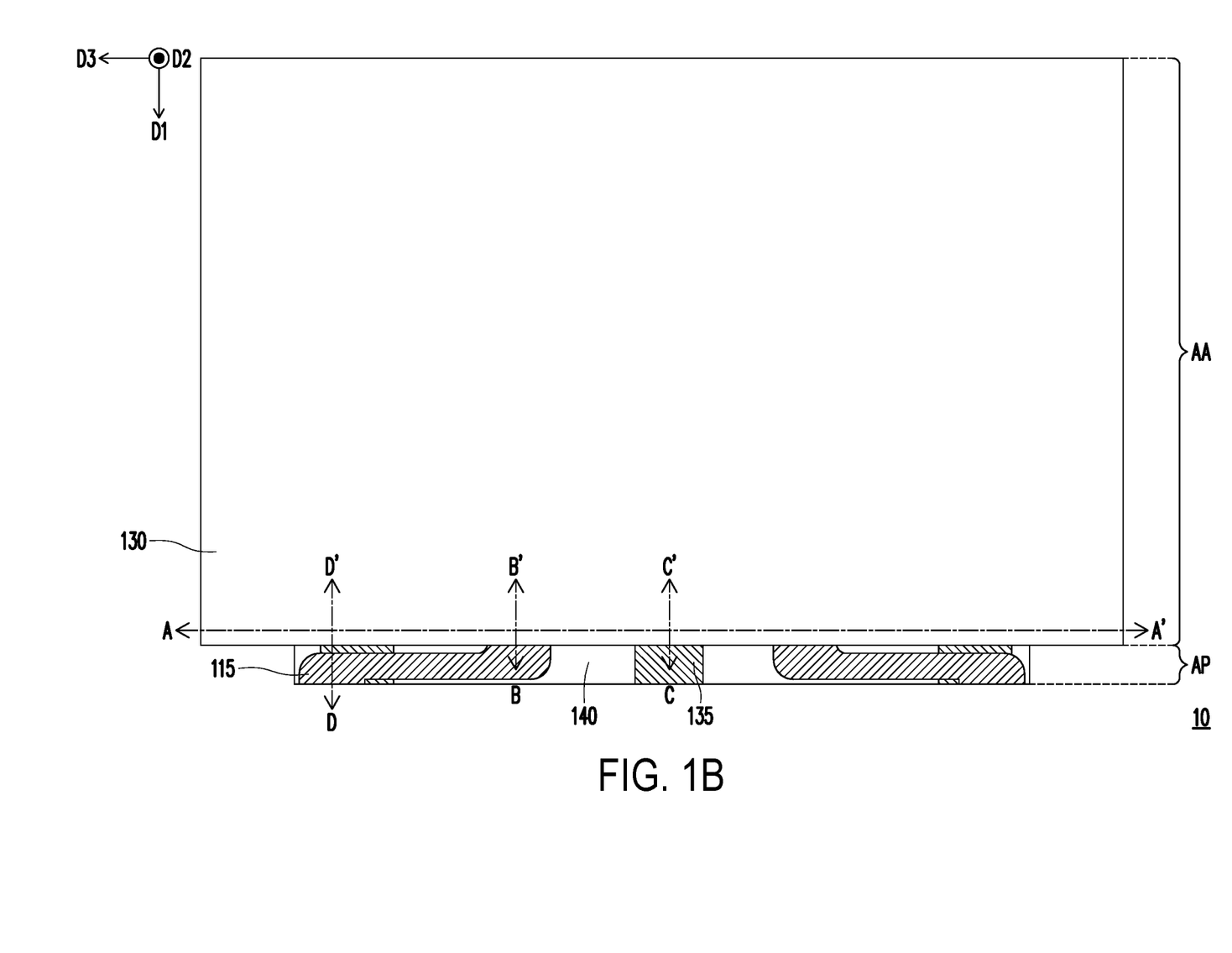
FIG. 1B is a top schematic diagram of a display device 10 according to an embodiment of the disclosure.
Figure 1C:
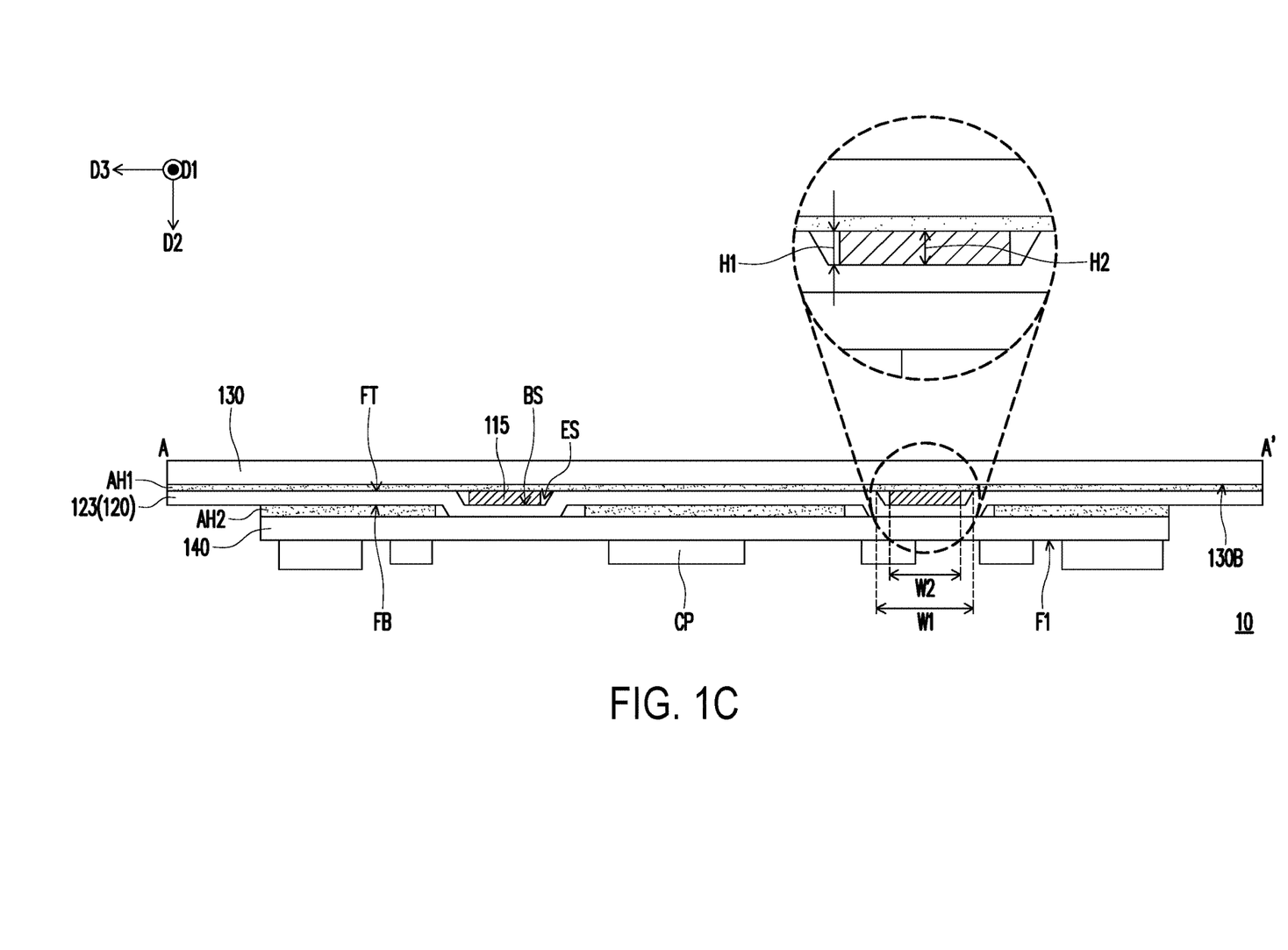
FIG. 1C is a cross-sectional schematic diagram along a section line A-A' of FIG. 1B.
Figure 1D:
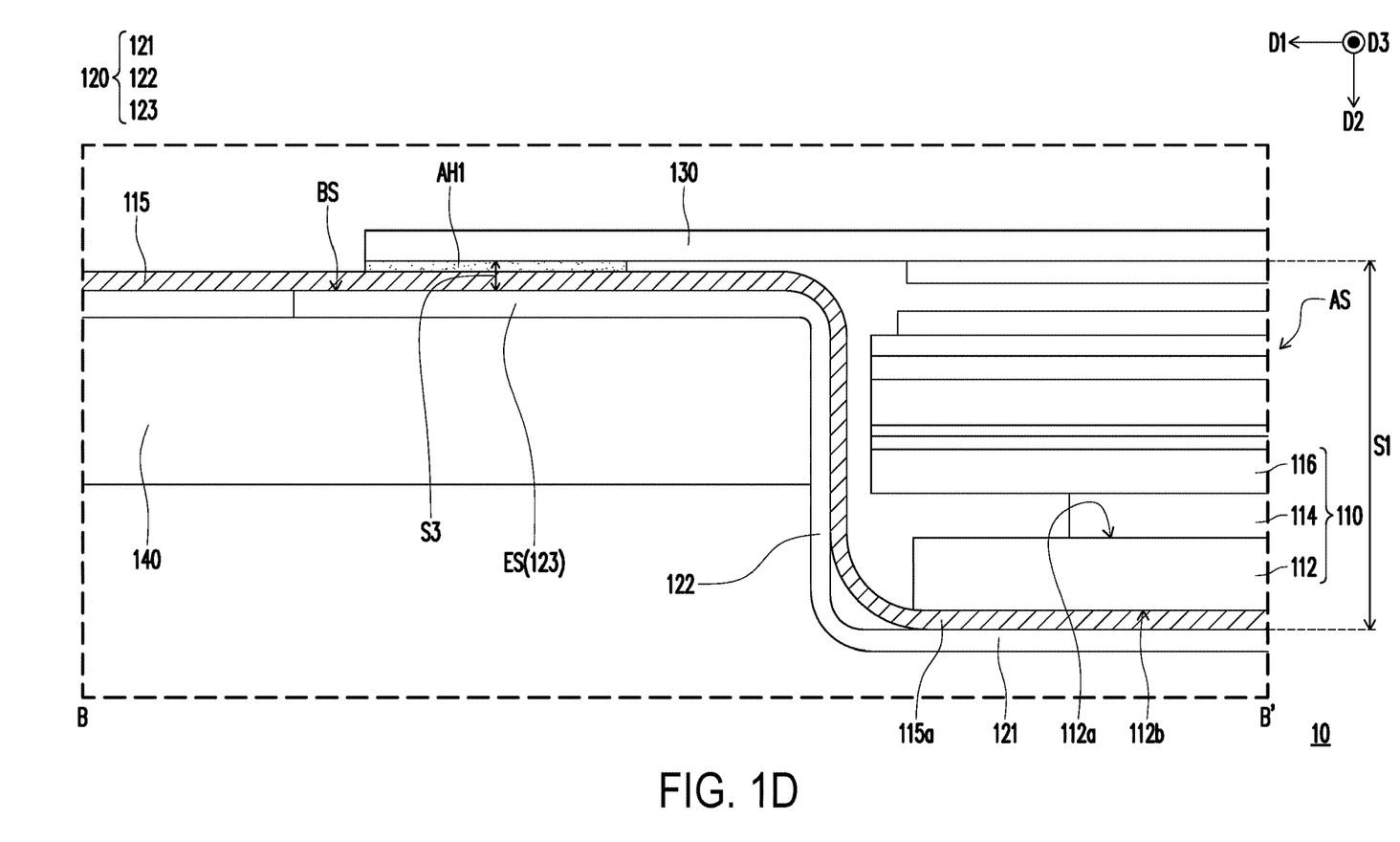
FIG. 1D is a cross-sectional schematic diagram along a section line B-B' of FIG. 1B.
Figure 1E:
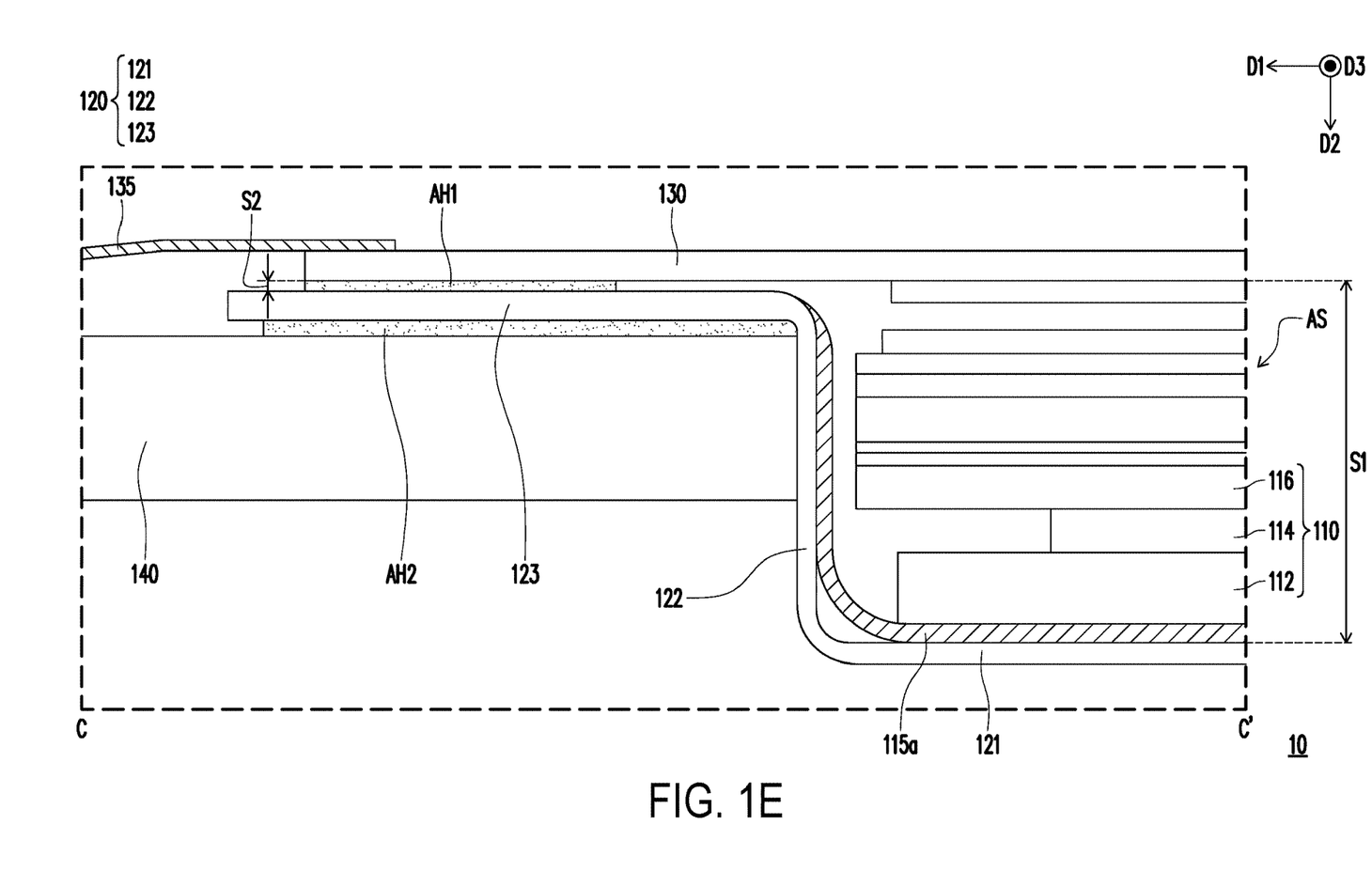
FIG. 1E is a cross-sectional schematic diagram along a section line C-C' of FIG. 1B.
Figure 1F:
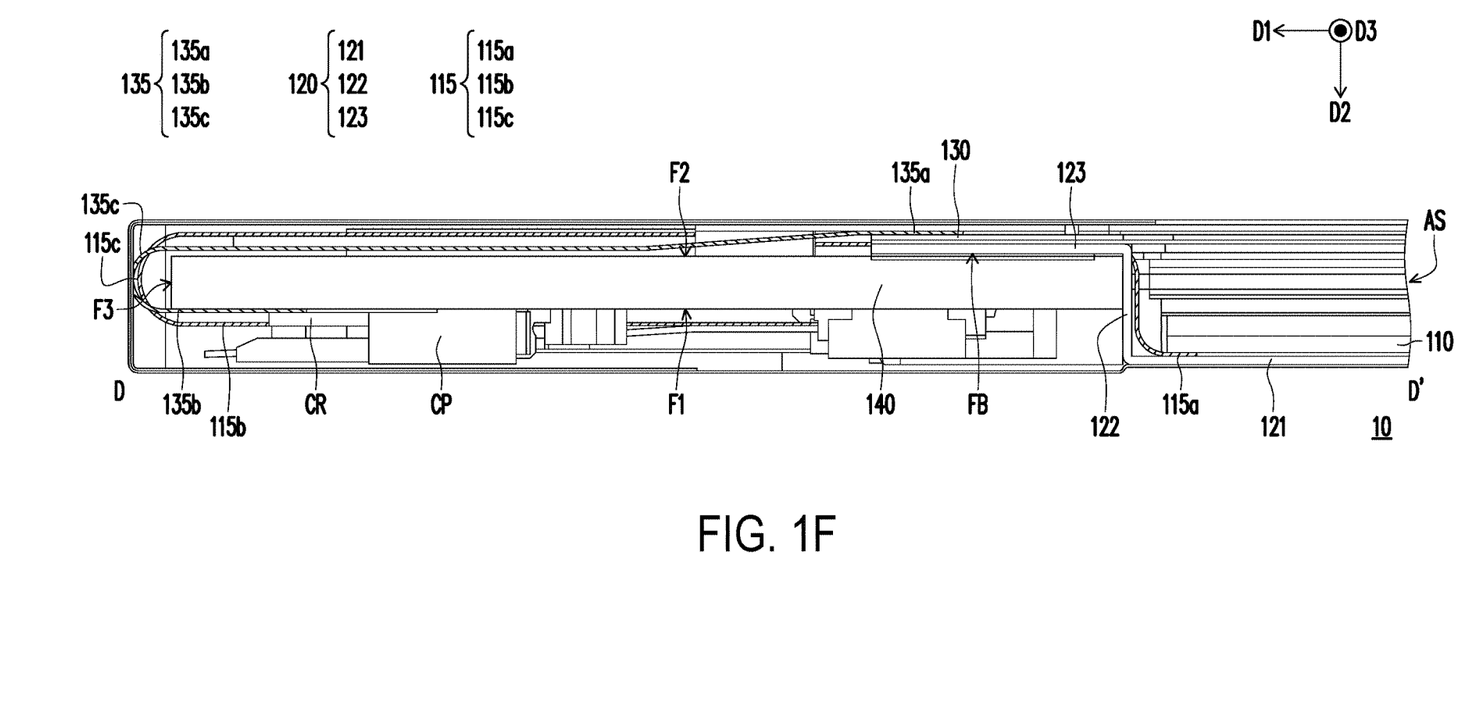
FIG. 1F is a cross-sectional schematic diagram along a section line D-D' of FIG. 1B.

FIG. 1A is an exploded schematic diagram of a display device 10 according to an embodiment of the disclosure. FIG. 1B is a top schematic diagram of a display device 10 according to an embodiment of the disclosure. FIG. 1C is a cross-sectional schematic diagram along a section line A-A' of FIG. 1B. FIG. 1D is a cross-sectional schematic diagram along a section line B-B' of FIG. 1B. FIG. 1E is a cross-sectional schematic diagram along a section line C-C' of FIG. 1B. FIG. 1F is a cross-sectional schematic diagram along a section line D-D' of FIG. 1B.

Referring to FIG. 1A to FIG. 1F, the display device 10 includes a light source module 110, a housing 120, a display panel 130, a circuit board 140, and a first flexible substrate 115. The housing 120 is located below the light source module and includes a base plate 121, a sidewall 122, and a support part 123. The sidewall 122 is connected to the base plate 121 to form an accommodation space AS for accommodating the light source module 110. The support part 123 is connected to the sidewall 122 and extends in a direction away from the sidewall 122. The support part 123 has at least one recess ES recessed towards an extending plane of the base plate 121. The number of recesses ES should correspond to the number of first flexible substrates 115, two are taken herein as an example. The display panel 130 is located above the light source module 110 and the support part 123 of the housing 120. The circuit board 140 is located below the support part 123 of the housing 120, and the support part 123 of the housing 120 is located between the display panel 130 and the circuit board 140. The first flexible substrate 115 connects the light source module 110 to the circuit board 140 through the recess ES of the support part 120, in which one side of the recess ES supports the display panel 130, and another side of the recess ES supports the circuit board 140.

In the display device 10 according to an embodiment of the disclosure, by supporting the display panel 130 with one side of the recess ES, and the circuit board 140 with the other opposite side of the recess ES, the overall structural stability of the display device 10 may be enhanced, thereby reducing the possibility of broken device and improving product yield. Hereinafter, with reference to FIG. 1A to FIG. 1F, the implementation of each element of the display device 10 will be continued to be described, but the disclosure is not limited thereto.

In the display device 10, the light source module 110 may be located between the housing 120 and the display panel 130. In some embodiments, the light source module 110 includes a substrate 112 and a light source 114 disposed on the substrate 112. In some embodiments, the light source 114 is a light-emitting diode (LED) array. In some embodiments, the light source 114 includes a mini light-emitting diode (Mini-LED) or a micro light-emitting diode (Micro-LED). In some embodiments, the light source 114 may also include a light-transmitting encapsulant covering the light-emitting diode.

In some embodiments, the light source module 110 further includes an optical film 116, and the optical film 116 is located between the light source 114 and the display panel 130. For example, the optical film 116 may include a polarizer, a diffuser, a prism, a composite optical film, or a combination thereof to adjust the uniformity of the emitted light from the light source module 110. Herein a direct light source module is taken as an example. In addition, when the light source module 110 is an edge-type light source module, the light source module 110 may further include a light guide plate.

In some embodiments, the sidewall 122 of the housing 120 connects the base plate 121 to the support part 123. In some embodiments, the base plate 121, the sidewall 122, and the support part 123 are integrally formed. In some embodiments, the sidewall 122 is substantially perpendicular to the extending plane of the base plate 121, so that when the light source module 110 is accommodated in the accommodation space AS surrounded by the base plate 121 and the sidewall 122, the light source module 110 may be adjacent to the extending plane of the base plate 121 and the extending plane of the sidewall 122. In some embodiments, the extending plane of the support part 123 is substantially perpendicular to the extending plane of the sidewall 122.

In some embodiments, the support part 123 and the base plate 121 are respectively connected to two opposite sides of the sidewall 122, and both the support part 123 and the base plate 121 extend in a direction away from the sidewall 122. In some embodiments, the support part 123 and the base plate 121 extend in different directions away from the sidewall 122. In some embodiments, the extending plane of the support part 123 is parallel to the extending plane of the base plate 121. In some embodiments, the recess ES of the support part 123 is formed by recessing from the extending plane of the support part 123 towards the extending plane of the base plate 121. In some embodiments, the support part 123 of the housing 120 has a top surface FT and a back surface FB opposite to each other, and the recess ES is formed by a portion of the top surface FT of the support part 123 recessing towards the back surface FB. In some embodiments, the bottom surface BS of the recess ES is substantially parallel to the extending plane of the support part 123 or the extending plane of the base plate 121.

In some embodiments, the support part 123 extends from the sidewall 122 along the first direction D1 away from the base plate 121, the recess ES is recessed along the second direction D2, and the first direction D1 is different from the second direction D2. In some embodiments, the long side of the support part 123 extends along the third direction D3, and the third direction D3 is different from the first direction D1 and the second direction D2. In some embodiments, the third direction D3 is substantially perpendicular to the first direction D1, and the third direction D3 is substantially perpendicular to the second direction D2. For example, the extending plane of the support part 123 extends along the first direction D1 and the third direction D3, the recess ES is formed by a portion of the extending plane of the support part 123 recessing towards the second direction D2, and the second direction D2 is the direction from the extending plane of the support part 123 to the extending plane of the base plate 121. In some embodiments, the second direction D2 is substantially perpendicular to the extending plane of the support part 123 and the extending plane of the base plate 121. In some embodiments, the housing 120 may be recycled or reused in other electronic products, such as electronic products with the same or similar structure as the display device 10, so as to achieve the goal of circular economy.

In some embodiments, a first spacing S1 is between the base plate 121 and the display panel 130, a second spacing S2 is between the support part 123 and the display panel 130, and a third spacing S3 is between the bottom surface BS of the recess ES and the display panel 130. The first spacing S1 is greater than the third spacing S3, and the third spacing S3 is greater than the second spacing S2, that is, S1>S3>S2.

The display panel 130 of the display device 10 may be a liquid crystal display panel (LCD), but the disclosure is not limited thereto. In some embodiments, the display panel 130 has a display area AA and a peripheral area AP, and the light source 114 of the light source module 110 overlaps the display area AA of the display panel 130. That is, the light source module 110 is a direct light source module, but the disclosure is not limited thereto. In some embodiments, when the light source module 110 is an edge-type light source module, the light source 114 of the light source module 110 may overlap the peripheral area AP of the display panel 130.

The circuit board 140 of the display device 10 may be adjacent to the back surface FB of the support part 123. In some embodiments, the circuit board 140 has a first surface F1 and a second surface F2 that are opposite to each other, and a side surface F3 connecting the first surface F1 and the second surface F2. The second surface F2 of the circuit board 140 faces the support part 123 of the housing 120. In some embodiments, the first flexible substrate 115 surrounds the second surface F2, the side surface F3, and the first surface F1 of the circuit board 140, and the first flexible substrate 115 is connected to the first surface F1 of the circuit board 140. In some embodiments, the first flexible substrate 115 passes the second surface F2, the side surface F3, and the first surface F1 of the circuit board 140 in sequence.

Referring to FIG. 1C, in some embodiments, the first flexible substrate 115 is accommodated in the recess ES of the support part 123, and the recess ES is located between the first flexible substrate 115 and the circuit board 140. In some embodiments, the depth H1 of the recess ES is greater than or equal to the thickness H2 of the first flexible substrate 115. In some embodiments, the width W1 of the recess ES along the third direction D3 is greater than or equal to the width W2 of the first flexible substrate 115. In some embodiments, the width W1 of the recess ES is substantially the same along the first direction D1. In other words, the recess ES has a rectangular top view shape, but the disclosure is not limited thereto. In some embodiments, the bottom surface BS of the recess ES is a plane or a curved surface. Since the bottom surface BS of the recess ES together with the first flexible substrate 115 may support the display panel 130, and the back surface FB of the recess ES may support the circuit board 140, the overall structural stability of the display device 10 is enhanced, thereby reducing the possibility of broken device. In some embodiments, when the display device 10 is a curved display, the continuous structure of the housing 120 may improve the strength and stability of the overall curved structure.

Referring to FIG. 1D and FIG. 1F at the same time, in some embodiments, the first flexible substrate 115 includes a light source connection part 115a, a circuit connection part 115b, and a bending part 115c. The bending part 115c connects the light source connection part 115a and the circuit connection part 115b. In some embodiments, the light source connection part 115a of the first flexible substrate 115 is connected to the light source module 110, and the circuit connection part 115b of the first flexible substrate 115 is connected to the circuit board 140. In some embodiments, the light source connection part 115a is disposed on the bottom surface 112b of the substrate 112 of the light source module 110, the light source 114 is disposed on the top surface 112a of the substrate 112, and the top surface 112a is opposite to the bottom surface 112b. That is, the light source connection part 115a and the light source 114 are respectively disposed on two opposite sides of the substrate 112. In this way, the first flexible substrate 115 may be prevented from covering the top surface 112a of the substrate 112 and affecting the light emission of the light source 114, preventing adverse effects onto the display area AA of the display panel 130.

Referring to FIG. 1C to FIG. 1E, in some embodiments, the display device 10 further includes a first adhesive member AH1. The first adhesive member AH1 covers the top surface FT of the support part 123 to fix the display panel 130 to the housing 120. In some embodiments, the first adhesive member AH1 continuously extends along the third direction D3, across the recess ES of the support part 123, and is continuously disposed on the top surface FT of the support part 123 to facilitate its attachment, but the disclosure is not limited thereto. In some embodiments, the first adhesive member AH1 is located between the display panel 130 and the support part 123 of the housing 120.

In some embodiments, the first flexible substrate 115 of the display device 10 is located between the first adhesive member AH1 and the bottom surface BS of the recess ES, so that the bottom surface BS of the recess ES accommodating the first flexible substrate 115 supports the bottom surface 130B of the display panel 130 by abutting the first adhesive member AH1. In other words, the bottom surface BS of the recess ES abuts the first flexible substrate 115 in the recess ES, and then indirectly abuts the first adhesive member AH1 to support the display panel 130. In some embodiments, the first flexible substrate 115 is a flexible printed circuit (FPC).

Referring to FIG. 1C and FIG. 1E, in some embodiments, the display device 10 further includes a second adhesive member AH2. The second adhesive member AH2 covers the back surface FB of the support part 123 to fix the circuit board 140 to the housing 120. In some embodiments, the second adhesive member AH2 discontinuously extends past the recess ES of the support part 123 and is spaced apart and disposed on the back surface FB of the support part 123. In some embodiments, the back surface FB of the recess ES of the support part 123 abuts the circuit board 140 to support the circuit board 140 together with the second adhesive member AH2. In some embodiments, the second adhesive member AH2 is located between the circuit board 140 and the support part 123 of the housing 120, and the sum of the thickness of the second adhesive member AH2 and the thickness of the support part 123 of the housing 120 is substantially equal to the sum of the thickness of the first flexible substrate 115 and the thickness of the bottom part of the recess ES. In some embodiments, the thickness of the bottom part of the recess ES is substantially equal to the thickness of the support part 123. In some embodiments, the thickness of the first flexible substrate 115 is substantially equal to the thickness of the second adhesive member AH2.

Referring to FIG. 1F, in some embodiments, the display device 10 further includes a second flexible substrate 135. In some embodiments, the second flexible substrate 135 includes a panel connection part 135a, a circuit connection part 135b, and a bending part 135c. The bending part 135c connects the panel connection part 135a and the circuit connection part 135b. In some embodiments, the panel connection part 135a of the second flexible substrate 135 is connected to the display panel 130, and the circuit connection part 135b of the second flexible substrate 135 is connected to the circuit board 140.

In some embodiments, the second flexible substrate 135 surrounds the second surface F2, the side surface F3, and the first surface F1 of the circuit board 140. In some embodiments, the second flexible substrate 135 passes the second surface F2, the side surface F3, and the first surface F1 of the circuit board 140 in sequence, and the second flexible substrate 135 is connected to the first surface F1 of the circuit board 140. In some embodiments, the second flexible substrate 135 is a flexible printed circuit.

In some embodiments, the second surface F2 of the circuit board 140 remains flat to facilitate attachment to the support part 123, and the first surface F1 of the circuit board 140 has space for accommodating electronic elements. For example, the display device 10 further includes a connector CR and an electronic element CP, and the connector CR and the electronic element CP may be disposed on the first surface F1 of the circuit board 140. In some embodiments, the circuit connection part 135b of the second flexible substrate 135 is bonded to the first surface F1 of the circuit board 140. In some embodiments, the circuit connection part 115b of the first flexible substrate 115 is connected to the connector CR located on the first surface F1 of the circuit board 140. In some embodiments, the electronic element CP includes a power board, a driver board, a timing control circuit (TCON), a display control board (AD board), a smart display module (SDM), etc.

In some embodiments, the assembly step of the display device 10 includes the following steps. The panel connection part 135a of the second flexible substrate 135 is connected to the display panel 130, and the circuit connection part 135b of the second flexible substrate 135 is connected to the circuit board 140. The circuit connection part 115b of the first flexible substrate 115 is inserted into the connector CR. The circuit board 140 is folded to the back surface FB of the support part 123. In some embodiments, the circuit board 140 is folded to the back surface FB of the support part 123 by bending the bending part 115c of the first flexible substrate 115 and the bending part 135c of the second flexible substrate 135. By folding the circuit board 140 to the back surface FB of the support part 123 so that the circuit board 140 and the support part 123 overlap, the frame of the display device 10 may be reduced.

Referring to FIG. 1F, in some embodiments, after the circuit board 140 is folded to the back surface FB of the support part 123, the circuit connection part 135b of the second flexible substrate 135, compared to the circuit connection part 115b of the first flexible substrate 115, is further away from the sidewall 122 of the housing 120. In other words, before the circuit board 140 is folded to the back surface FB of the support part 123, the connector CR is disposed on the circuit board 140 at a location further away from the sidewall 122 than the bonded location of the circuit board 140 and the circuit connection part 135b, to prevent the connector CR from interfering with the connection of the circuit connection part 135b to the circuit board 140.

Referring to FIG. 1B, in some embodiments, the first flexible substrate 115 overlaps the second flexible substrate 135, and the first flexible substrate 115 and the second flexible substrate 135 are arranged side by side in the second direction D2. In this way, the central area of the first surface F1 of the circuit board 140 may have a relatively large space for arranging electronic components.

Hereinafter, other embodiments of the disclosure will be described with reference to FIG. 2 to FIG. 3, and the reference numbers and related contents of the embodiments of FIG. 1A to FIG. 1F will be used. The same or similar reference numerals are used to denote the same or similar elements, and the description of the same technical content is omitted. For the description of the omitted part, reference may be made to the embodiments of FIG. 1A to FIG. 1F, which will not be repeated in the following description.

Figure 2:
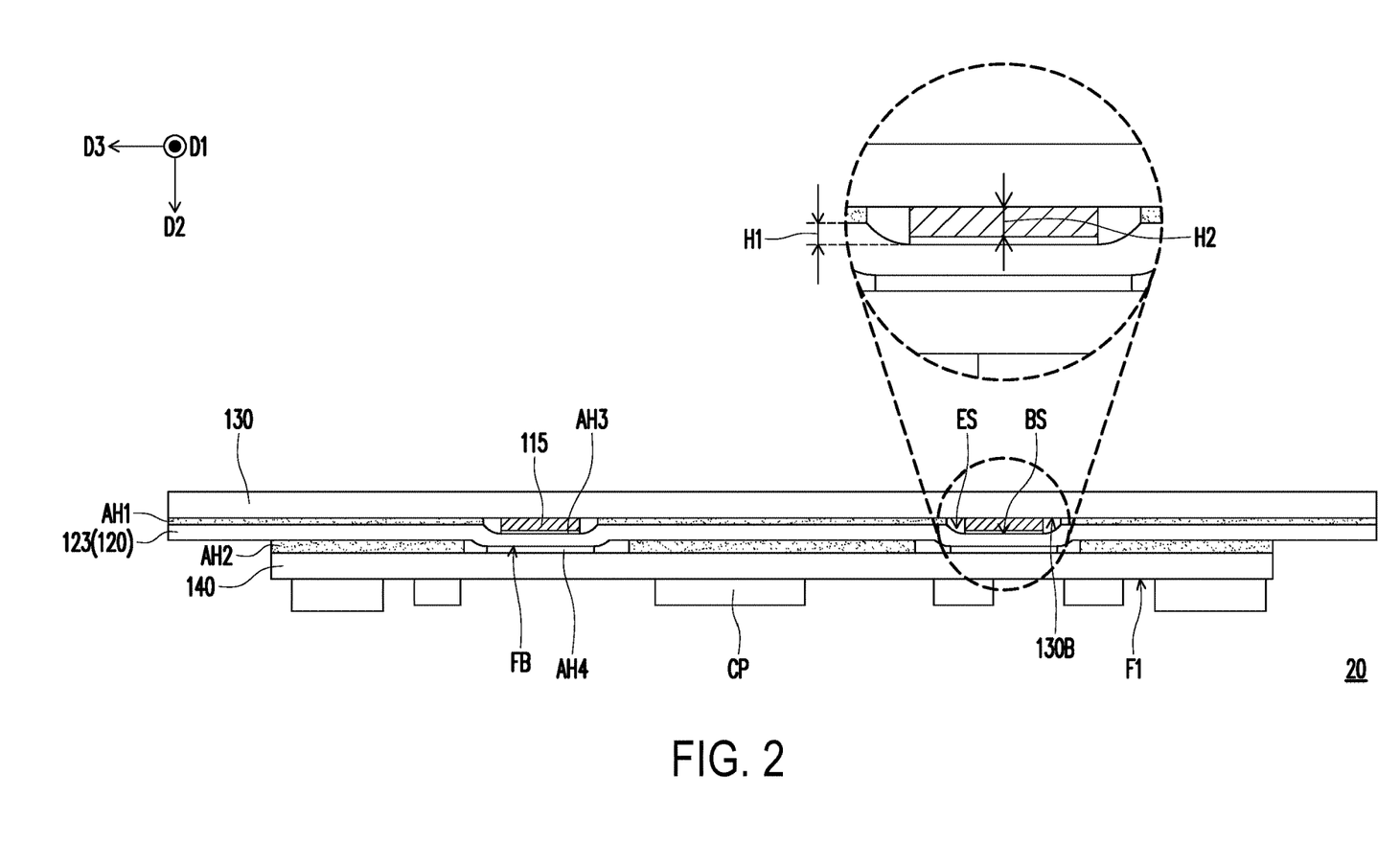
FIG. 2 is a cross-sectional schematic diagram of a display device 20 according to an embodiment of the disclosure.

FIG. 2 is a cross-sectional schematic diagram of a display device 20 according to an embodiment of the disclosure. Compared with the display device 10 shown in FIG. 1A to FIG. 1F, the difference of the display device 20 shown in FIG. 2 is mainly that the first adhesive member AH1 of the display device 20 discontinuously extends past the recess ES of the support part 123 along the third direction D3, so that the first adhesive member AH1 does not exist between the first flexible substrate 115 and the display panel 130. In this way, the first flexible substrate 115 is not covered by the first adhesive member AH1, and the bottom surface BS of the recess ES accommodating the first flexible substrate 115 may support the display panel 130 by abutting the first flexible substrate 115. Therefore, the first adhesive member AH1 may be prevented from adhering to the first flexible substrate 115, thereby facilitating rework. In some embodiments, the depth H1 of the recess ES may also be less than the thickness H2 of the first flexible substrate 115 to ensure that the first flexible substrate 115 may effectively support the bottom surface 130B of the display panel 130.

In some embodiments, the display device 20 further includes a third adhesive member AH3. The third adhesive member AH3 is located between the first flexible substrate 115 and the bottom surface BS of the recess ES and may be configured to fix the first flexible substrate 115 and adjust the height of the first flexible substrate 115. In addition, the first flexible substrate 115 is fixed to the bottom surface BS of the recess ES through the third adhesive member AH3, which may also prevent the first flexible substrate 115 from protruding beyond the recess ES and lifting the display panel 130 due to the rigidity of the material of the first flexible substrate 115, thereby preventing the display panel 130 from being subjected to uneven stress.

In some embodiments, the back surface FB of the recess ES is the ground terminal of the display device 20. In some embodiments, the display device 20 further includes a fourth adhesive member AH4, and the fourth adhesive member AH4 is located between the back surface FB of the recess ES and the circuit board 140. In some embodiments, the fourth adhesive member AH4 is electrically conductive, to electrically connect the circuit board 140 to the ground terminal of the display device 20.

Figure 3:
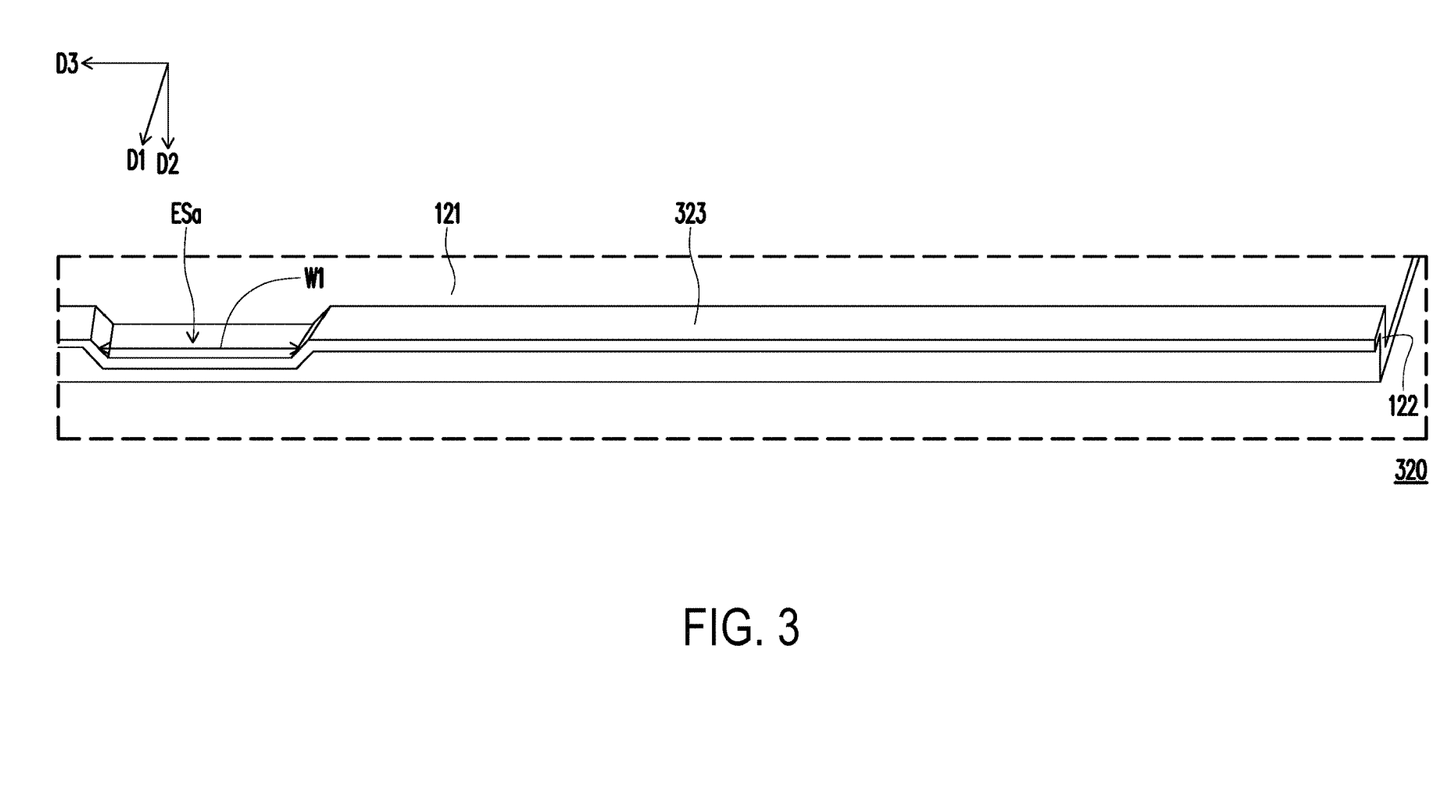
FIG. 3 is a partial three-dimensional diagram of the housing 320 of a display device according to an embodiment of the disclosure.

FIG. 3 is a partial three-dimensional diagram of the housing 320 of a display device according to an embodiment of the disclosure. Compared with the housing 120 of the display device 10 shown in FIG. 1A to FIG. 1F, the difference of the housing 320 shown in FIG. 3 is mainly that the housing 320 includes a base plate 121, a sidewall 122, and a support part 323, and the recess ESa of the support part 323 of the housing 320 has a trapezoidal top view shape. In some embodiments, when the width of the first flexible substrate 115 narrows along the first direction D1, the width W1 of the recess ESa may also narrow along the first direction D1, facilitating the accommodation of the first flexible substrate 115 within the recess ESa.

To sum up, for the display device of the disclosure, by supporting the display panel with one side of the recess, and the circuit board with the other opposite side of the recess, the overall structural stability of the display device may be enhanced, thereby reducing the possibility of broken device and improving product yield. In addition, the housing of the disclosure may be recycled or reused in other electronic products with the same or similar structure, thereby achieving the goal of circular economy.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A display device, comprising:
a light source module;
a housing, comprising:
a base plate, located below the light source module;
a sidewall, connected to the base plate to form an accommodation space for accommodating the light source module; and
a support part, connected to the sidewall and extending in a direction away from the base plate, wherein the support part has a recess recessed towards an extending plane of the base plate;
a display panel, located above the light source module and the support part of the housing;

a circuit board, located below the support part of the housing, wherein the support part of the housing is located between the display panel and the circuit board; and a first flexible substrate, connecting the light source module and the circuit board and passing through the recess of the support part, wherein one side of the recess supports the display panel, and another side of the recess supports the circuit board, the support part of the housing has a top surface and a back surface opposite to each other, and the recess is recessed from the top surface towards the back surface; and a first adhesive member located between the back surface of the recess and the circuit board, wherein the first adhesive member is electrically conductive.

2. The display device according to claim 1, further comprising a second adhesive member covering the top surface of the support part.

3. The display device according to claim 2, wherein the second adhesive member continuously extends across the recess of the support part.

4. The display device according to claim 3, wherein the first flexible substrate is located between the second adhesive member and a bottom surface of the recess.

5. The display device according to claim 2, wherein the second adhesive member discontinuously extends past the recess of the support part, and the first flexible substrate is not covered by the second adhesive member.

6. The display device according to claim 1, further comprising a third adhesive member covering the back surface of the support part.

7. The display device according to claim 6, wherein the third adhesive member discontinuously extends past the recess of the support part, and the third adhesive member is spaced apart and disposed on the back surface of the support part.

8. The display device according to claim 1, wherein the back surface of the recess abuts the circuit board.

9. The display device according to claim 1, further comprising a fourth adhesive member located between the first flexible substrate and a bottom surface of the recess.

10. The display device according to claim 1, wherein the display panel has a display area and a peripheral area, the light source module comprises a substrate and a light source located above the substrate, and the light source overlaps the display area.

11. The display device according to claim 10, wherein the first flexible substrate has a light source connection part connected to the light source module, and the light source connection part and the light source are respectively disposed on two opposite sides of the substrate.

12. The display device according to claim 1, wherein the circuit board has a first surface and a second surface opposite to each other, and a side surface connecting the first surface and the second surface, the second surface of the circuit board faces the support part of the housing, the first flexible substrate passes the second surface, the side surface, and first surface of the circuit board in sequence, and the first flexible substrate is connected to the first surface of the circuit board.

13. The display device according to claim 12, further comprising a second flexible substrate connected to the display panel, wherein the second flexible substrate is connected to the first surface of the circuit board by passing the second surface, the side surface, and first surface of the circuit board in sequence.

14. The display device according to claim 13, wherein the second flexible substrate is directly bonded to the first surface of the circuit board, and the first flexible substrate is connected to a connector on the first surface of the circuit board.

15. The display device according to claim 14, wherein compared with the connector, the second flexible substrate is bonded to the circuit board at a location further away from the sidewall of the housing.

16. The display device according to claim 1, wherein a depth of the recess is less than a thickness of the first flexible substrate.

17. The display device according to claim 1, wherein a first spacing is between the base plate and the display panel, a second spacing is between the support part and the display panel, a third spacing is between the bottom surface of the recess and the display panel, the first spacing is greater than the third spacing, and the third spacing is greater than the second spacing.

* * * * *